(12) United States Patent
Chen et al.

(10) Patent No.: US 11,930,675 B2
(45) Date of Patent: Mar. 12, 2024

(54) ELECTRONIC DEVICE

(71) Applicant: InnoLux Corporation, Miao-Li County (TW)

(72) Inventors: Jia-Yuan Chen, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 51 days.

(21) Appl. No.: 17/335,090

(22) Filed: Jun. 1, 2021

(65) Prior Publication Data
US 2022/0007504 A1  Jan. 6, 2022

(30) Foreign Application Priority Data
Jul. 1, 2020 (CN) .......................... 202010618729.0

(51) Int. Cl.
*H10K 59/131* (2023.01)
*G02F 1/1333* (2006.01)
*G02F 1/1345* (2006.01)
*H01L 25/16* (2023.01)

(52) U.S. Cl.
CPC ....... *H10K 59/131* (2023.02); *G02F 1/13336* (2013.01); *G02F 1/1345* (2013.01); *H01L 25/167* (2013.01)

(58) Field of Classification Search
CPC ............. G02F 1/13336; G02F 1/13452; G02F 1/13454; G02F 1/13458; H01L 25/0753; G09F 9/302; G09F 9/3023; G09F 9/3026
See application file for complete search history.

(56) References Cited

U.S. PATENT DOCUMENTS

| 2005/0286004 | A1* | 12/2005 | Lee ...................... G02F 1/1345 349/139 |
| 2016/0254267 | A1* | 9/2016 | Tao ........................ H01L 27/11 438/637 |
| 2019/0304386 | A1 | 10/2019 | Kim |
| 2020/0020272 | A1* | 1/2020 | Huang ................. H01L 27/326 |
| 2020/0259056 | A1* | 8/2020 | Hong .................. H01L 27/1262 |
| 2021/0066267 | A1* | 3/2021 | Li ........................... H01L 33/62 |
| 2021/0200006 | A1* | 7/2021 | Ryu ..................... G02F 1/1339 |

FOREIGN PATENT DOCUMENTS

| CN | 110164876 | | 8/2019 |
| JP | 2018141944 | | 9/2018 |
| KR | 20160044619 A | * | 4/2016 |
| WO | 2017/116006 A1 | | 7/2017 |
| WO | 2020/036277 A1 | | 2/2020 |
| WO | 2020/087525 A1 | | 5/2020 |

* cited by examiner

Primary Examiner — Alexander P Gross
(74) Attorney, Agent, or Firm — Winston Hsu

(57) ABSTRACT

An electronic device includes a substrate, a first signal line, a second signal line, a first conductive pattern and a second conductive pattern. The substrate has a top surface and a side surface surrounding the top surface. The first signal line and a second signal line are disposed on the top surface. The first conductive pattern is disposed on the side surface and electrically connected to the first signal line. The second conductive pattern is disposed on the side surface and electrically connected to the second signal line. The first conductive pattern and the second conductive pattern have different electrical resistances.

4 Claims, 11 Drawing Sheets

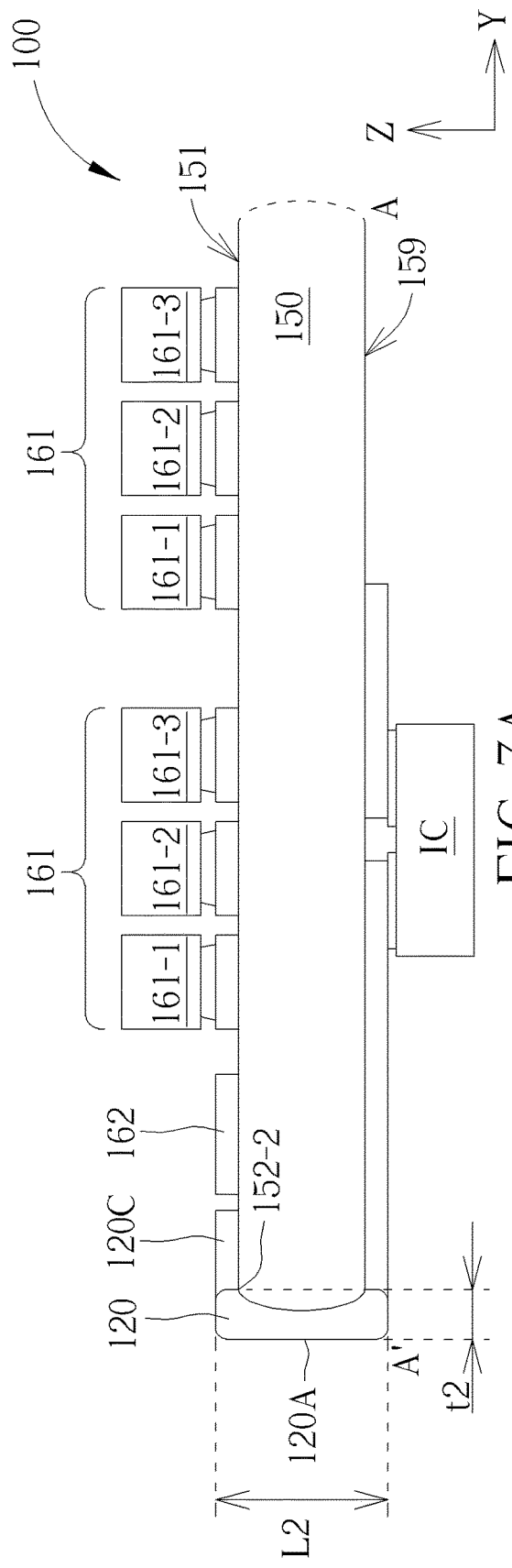
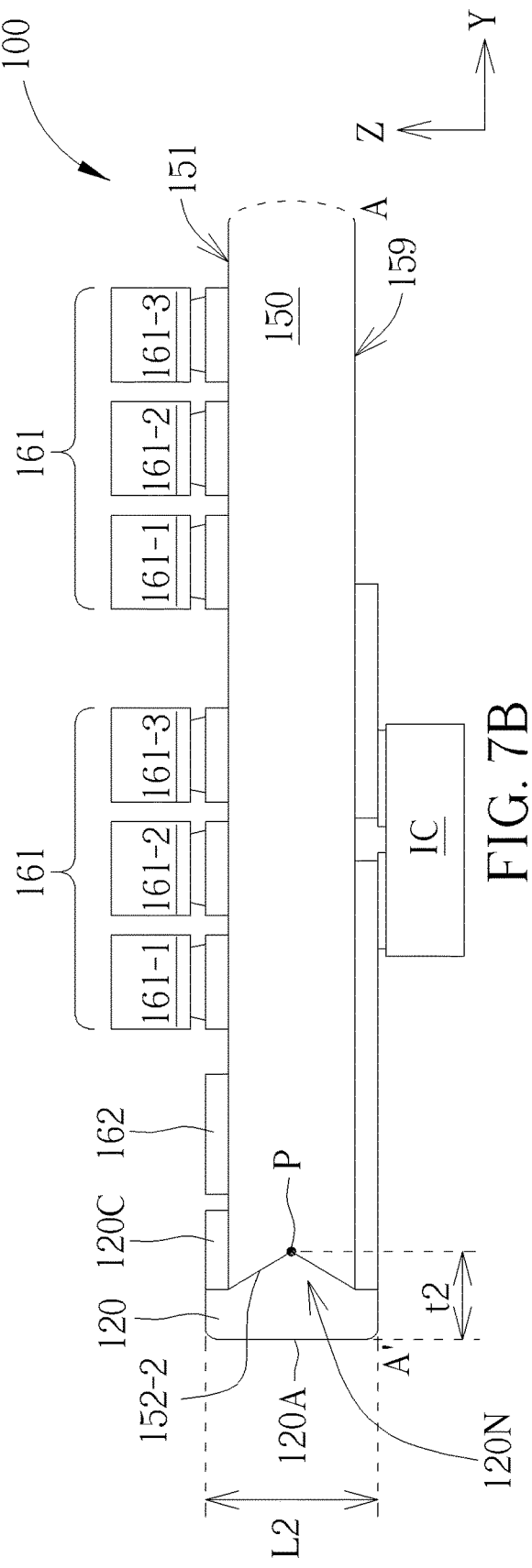
FIG. 7A
FIG. 7B

ELECTRONIC DEVICE

BACKGROUND OF THE DISCLOSURE

1. Field of the Disclosure

The present disclosure relates to an electronic device, in particular to an electronic device with conductive patterns of different electrical resistances.

2. Description of the Prior Art

With the development of technology and the demand for use, large-scale electronic devices made by tiling have gradually become popular in life. In order to reduce the presence of slits between tiling panels, currently in the industry signals are provided through the bending of soft panels to reduce the gaps between panels. However, the bending of soft panels requires a certain amount of space to make it impossible realize true seamless tiling.

As consumers have higher and higher standards for display devices, it is one of the important issues for the manufacturers to develop seamless tiling display devices.

SUMMARY OF THE DISCLOSURE

In view of this, it is intended to correspondingly adjust the electrical resistance of the conductive pattern according to the required signal loading design to facilitate the innovation of seamless tiling displays. For example, different conductive patterns corresponding to different signals have different electrical resistances.

According to some embodiments of the present disclosure, an electronic device is provided to include a substrate, a first signal line, a second signal line, a first conductive pattern and a second conductive pattern. The substrate has a top surface and a side surface surrounding the top surface. The first signal line and a second signal line are disposed on the top surface. The first conductive pattern is disposed on the side surface and electrically connected to the first signal line. The second conductive pattern is disposed on the side surface and electrically connected to the second signal line. The first conductive pattern and the second conductive pattern have different electrical resistances.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 7A illustrates a schematic side view of a variant implementation of the electronic device of the present disclosure.

FIG. 7B illustrates a schematic side view of another variant implementation of the electronic device of the present disclosure.

DETAILED DESCRIPTION

Figure 1:
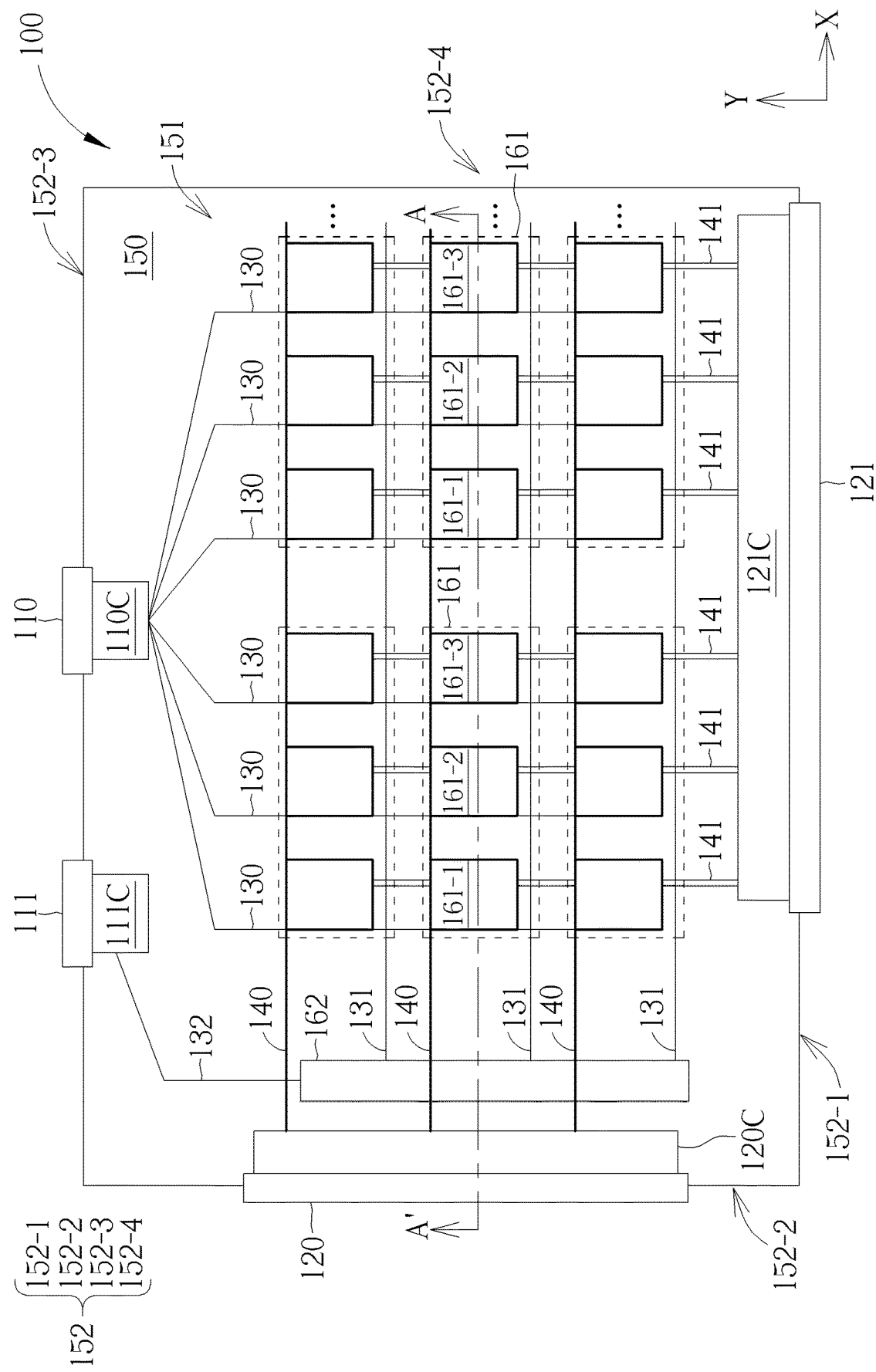
FIG. 1 illustrates a schematic top view of the electronic device according to the first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function.

In the following description and in the claims, the terms "include", "comprise" and "have" are used in an open-ended fashion, and thus should be interpreted to mean "include, but not limited to".

When a component or a film layer is referred to as "disposed on another component or another film layer" or "electrically connected to another component or another film layer", it may mean that the component or film layer is directly disposed on another component or film layer, or directly connected to another component or film layer, or there may be other components or film layers in between. In contrast, when a component is said to be "directly disposed on another component or film" or "directly connected to another component or film", there is no component or film which inserts between the two.

The terms used in the specification and claims, such as "first", "second", etc., are used to indicate elements in the claims. They do not imply and represent any sequential order in the claims, nor does it represent the order of a certain claimed element with respect to another claimed element, or the order of the manufacturing method. The use of these ordinal numbers is only to clearly distinguish a claimed element with a certain name from another claimed element with the same name.

The technical features in different embodiments described in the following may be replaced, recombined, or mixed with one another to constitute another embodiment without departing from the spirit of the present disclosure.

The terms "about", "substantially", "equal", or "$_{same}$" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The electronic device 100 of the present disclosure may include, for example, a display device, an antenna device, a sensing device, a touch display device, a curved display device, or a free shape display device, or a bendable or a flexible tiling electronic device, but it is not limited thereto. An electronic device may include, for example, a light-emitting diode, liquid crystal, fluorescence, phosphor, other suitable display media, or a combination of the above, but it is not limited thereto. An antenna device may be, for example, a liquid crystal antenna, it is not limited thereto. It should be noted that the electronic device may be any combination of the above, and it is not limited thereto. In addition, the appearance of the electronic device may be rectangular, circular, polygonal, a shape with curved edges, or other suitable shapes. The electronic device may have peripheral systems such as a driving system, a control system, a light source system, a shelf system . . . etc. to support a display device or an antenna device. The following takes a display device as an example, but the present disclosure is not limited to this.

FIG. 1 is a schematic top view of an electronic device 100 according to the first embodiment of the present disclosure. Please refer to FIG. 1, the electronic device 100 includes a conductive pattern 110, a conductive pattern 111, a conductive pattern 120, a conductive pattern 121, a signal line 130, a signal line 131, a signal line 132, a signal line 140, a signal line 141, a substrate 150 and a plurality of display units 161. The substrate 150 has a top surface 151 and a side surface 152. In some embodiments, the normal direction of the side surface 152 of the present disclosure may not be parallel to the normal direction of the top surface 151. In other words, the normal direction of the side surface 152 and the normal direction of the top surface 151 may have an angle not equal to zero degree or to 180 degrees. The side surface 152 surrounds the top surface 151, that is, the side surface 152 includes, for example, four portions: a side surface 152-1, a side surface 152-2, a side surface 152-3 and a side surface 152-4, which are respectively disposed on the periphery four sides of the top surface 151, but the present disclosure is not limited thereto. The side surface 152 may also include more than or less than four portions according to the shape of the substrate 150.

In an embodiment, the substrate 150 may include a material which has a supporting function; the substrate 150 may be a rigid substrate or a flexible substrate. The materials of the substrate 150 include, for example, glass, quartz, ceramic, sapphire or plastic etc., but the present disclosure is not limited thereto. In another embodiment, the materials of the substrate 150 may include a suitable opaque material. In some embodiments when the substrate 150 is a flexible substrate, it may include a suitable flexible material, such as polycarbonate (PC), polyimide (PI), polypropylene (PP) or polyethylene terephthalate (PET), other suitable materials, or a combination of the above materials, but the present disclosure is not limited thereto. It is noted that the present disclosure is not limited to the shape of the substrate 150 illustrated in the drawings. The substrate 150 may be circular, trapezoidal, quadrilateral or other free shapes, as long as it achieves the efficacy of the present disclosure.

In an embodiment of the present disclosure, a plurality of display units 161 of the electronic device 100 may be disposed on the substrate 150. A plurality of display units 161 may include any suitable types of display elements, display media, and/or auxiliary materials. For example, they may include liquid crystal, fluorescence, phosphor, organic or inorganic light-emitting diodes, other suitable materials or components, or any combination of the above, but the present disclosure is not limited thereto. In another embodiment, the electronic device 100 may include at least one display unit (not shown).

Taking the electronic device 100 to be an active light-emitting device as an example, the display unit, for example the display unit 161, may include a single light-emitting unit or a plurality of light-emitting units. For example, FIG. 1 illustrates that at least one display unit 161 includes a light-emitting unit 161-1, a light-emitting unit 161-2 and a light-emitting unit 161-3, but the present disclosure is not limited thereto. The light-emitting units in a display unit may respectively include various different colors, for example include red (R), green (G), blue (B) and white (W), but the present disclosure is not limited thereto. The light-emitting unit may include an organic light-emitting diode (OLED), a micro light-emitting diode (micro-LED), a mini-LED, a quantum dot LED (QDLED), a nano wire LED or a bar type LED, but the present disclosure is not limited thereto. The types of the light-emitting diodes are not limited, for example, they may be a flip chip type light-emitting diode or a vertical type light-emitting diode, but the present disclosure is not limited thereto.

The electronic device 100 of the present disclosure may include a plurality of signal lines, for example the signal line 130, the signal line 131, the signal line 132, the signal line 140 and the signal line 141 illustrated in FIG. 1, and they may be respectively disposed on the top surface 151 of the substrate 150. In one embodiment, a signal line may be a signal line which transmits various signals, for example transmits a current, a voltage, a high-frequency signal or a low-frequency signal, and the present disclosure is not limited thereto. In an embodiment of the present disclosure, the signal line 130, the signal line 131, the signal line 132, the signal line 140 or the signal line 141 may be respectively electrically connected to the light-emitting units in the plurality of display units 161 to drive the display status of each display unit 161, for example on and off. Specifically speaking, taking FIG. 1 as an example, the signal line 130 is electrically connected to the light-emitting unit 161-1, the light-emitting unit 161-2 and the light-emitting unit 161-3 in a plurality of display units 161; the signal line 140 is electrically connected to the light-emitting unit 161-1, the light-emitting unit 161-2 and the light-emitting unit 161-3 in a plurality of display units 161. A plurality of signal lines of the electronic device 100 may be respectively a transparent or an opaque conductive material, for example, may include a transparent conductive material, a metal, or a combination of the above, but the present disclosure is not limited thereto. In an embodiment of the present disclosure, the signal line 130 may be a data line, and the signal line 140 may be a drain line, which means that the signal line 130 is a signal line for transmitting a data signal. The signal line 140 is a signal line for transmitting the VDD voltage of the device, but the present disclosure is not limited thereto. In another embodiment, the signal line 140 may be a data line, and the signal line 130 may be a drain line. In another embodiment of the present disclosure, the signal line 131 may be a gate line. It is noted that there are only five types of signal lines illustrated in FIG. 1, but the present disclosure is not limited thereto. There may be more than or less than five signal lines as long as the efficacy of the present disclosure is achieved. In addition, the electronic device 100 of the present disclosure may also include (not shown) back to back diodes, optical sensors, touch electrodes, or other components needed in the electronic device 100.

Please refer to FIG. 1, the conductive pattern 110 and/or the conductive pattern 111 are disposed on a part of the side surface 152 (for example, on the side surface 152-4), and electrically connected to a plurality of signal lines, for example the conductive pattern 110 is electrically connected to the signal line 130; the conductive pattern 111 is electrically connected to the signal line 132. In other words, the conductive pattern 110 may provide the signal line 130 with a signal or a voltage, and the conductive pattern 111 may provide the signal line 132 with a signal or a voltage. The conductive pattern 120 is disposed on one of the side surfaces 152 (for example, on the side surface 152-2), and is electrically connected to, for example, the signal line 140. In other words, the conductive pattern 120 may provide the signal line 140 with a signal or a voltage. The conductive pattern 121 may be disposed on one of the side surfaces 152 (for example, on the side surface 152-1), and is electrically connected to, for example, the signal line 141. In other words, the conductive pattern 121 may provide the signal line 141 with a signal or a voltage. It is noted that the locations of the conductive pattern 110, of the conductive pattern 111, of the conductive pattern 120 or of the conductive pattern 121 in FIG. 1 are only some of the embodiments of the present disclosure, and are not limited thereto. The conductive pattern referred to in the present disclosure may be a patterning result after a special process, for example, a conductive material may be patterned by a process such as a lithographic process, print, electroplating, coating. The conductive pattern of the present disclosure is not limited to a certain shape and it may be the conductive pattern of the present disclosure as long as it has the function of providing the signal lines with signals. A signal of the present disclosure may be a suitable signal such as a voltage signal, a current signal, a high-frequency signal or a low-frequency signal, and the present disclosure is not limited thereto. The conductive pattern disposed on a side surface refers to that at least a part of the conductive pattern may be disposed on a side surface. For example, a conductive pattern may extend to the top surface 151 or be disposed only on the side surface. In an embodiment of the present disclosure, different signal lines may correspond to different conductive patterns in response to different signals, and the corresponding conductive patterns may provide different electrical resistance values in accordance with different signal lines. For example, the conductive pattern 110, the conductive pattern 111, the conductive pattern 120 and the conductive pattern 121 may respectively have the same or different electrical resistance values to correspond to different signal lines. The different electrical resistance values among the conductive pattern 110, the conductive pattern 111, the conductive pattern 120 and the conductive pattern 121 may be formed by means of a variety of different embodiments. For example, they may be formed by means of a difference in quantity, in width, in thickness, in material or in shape, and the present disclosure is not limited thereto. In another embodiment, the area of the conductive pad 110C corresponding to the conductive pattern 110 and/or the area of the conductive pad 111C corresponding to the conductive pattern 111 may be smaller than that of the conductive pad 120C corresponding to the conductive pattern 120 and/or than that of the conductive pad 121C corresponding to the conductive pattern 121 to correspondingly provide different electrical resistance values, but the present disclosure is not limited thereto. In a variant embodiment, the relative relationship of the area sizes of the conductive pads to which each conductive pattern corresponds may also be interchanged.

Figure 2A:
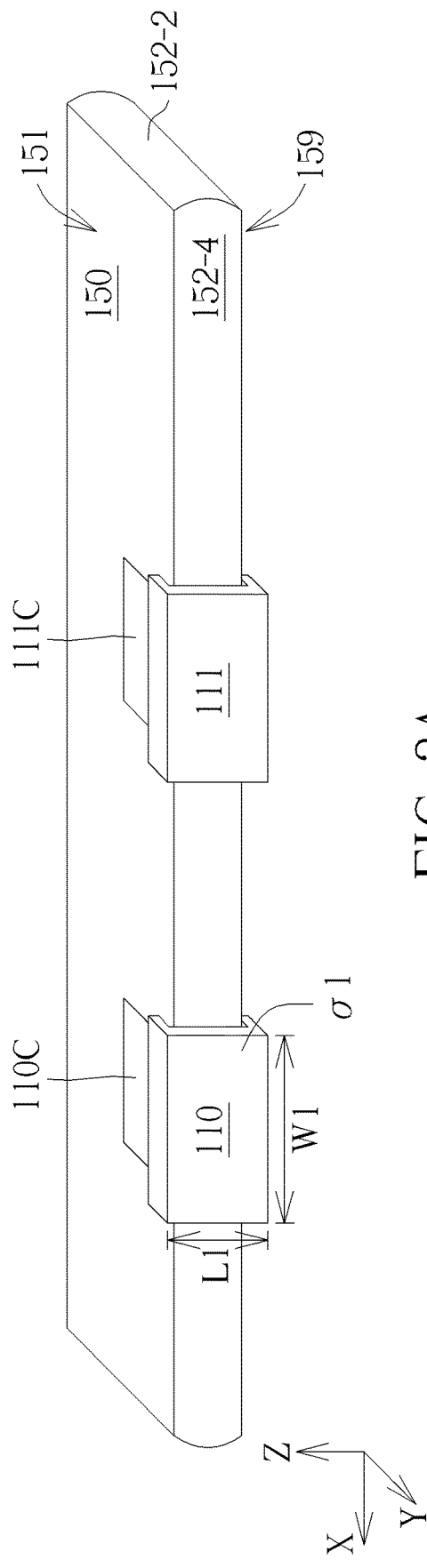
FIG. 2A and FIG. 2B illustrate partial schematic side views corresponding to FIG. 1.
Figure 2B:
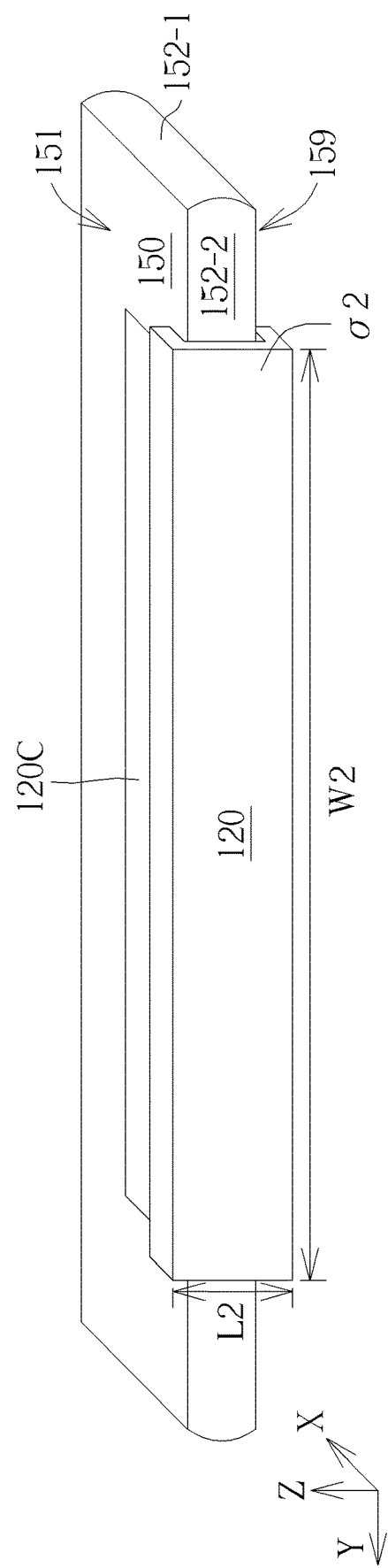

Please refer to FIGS. 2A and 2B. FIGS. 2A and 2B show a side view direction corresponding to FIG. 1. FIG. 2A and FIG. 2B respectively illustrate a partial side view of different conductive patterns in an embodiment of the electronic device 100 of the present disclosure. As shown in the figures, the substrate 150 may have a bottom surface 159 opposite to the top surface 151. On the bottom surface 159 there may be a driving integrated circuit (not shown), and the driving integrated circuit may be electrically connected to the electronic components on the top surface 151, such as the light-emitting unit 161-1, the light-emitting unit 161-2 or the light-emitting unit 161-3, through the conductive patterns. In another embodiment, a conductive pattern, for example, the conductive pattern 120 may be disposed on the side surface 152-2 and may extend to the top surface 151 and to the bottom surface 159. In an implementation of this embodiment, the electrical resistance values of two of the conductive patterns in the electronic device 100 may be different. For example, the conductive pattern 110 and the conductive pattern 120 may have different resistance values. The different electrical resistances between the two conductive patterns are formed by means of a difference in widths of the conductive pattern 110 and of the conductive pattern 120. By adjusting different widths, the electrical impedance of each conductive pattern may be adjusted to separately result in different electrical resistances. For example, the conductive pattern 110 has a width W1 and a height L1, and the conductive pattern 120 has a width W2 and a height L2. If W1 is not equal to W2, the conductive pattern 110 and the conductive pattern 120 may have different electrical resistances. It is noted that this embodiment may not limit other conditions of the conductive patterns, for example, the number, the shape, the thickness, and the material of two or more conductive patterns may be the same or different. In an embodiment, the width W1 of the conductive pattern 110 may be the minimal width measured along the X axis; the width W2 of the conductive pattern 120 may be the minimal width measured along the Y axis; the length L1 of the conductive pattern 110 or the length L2 of the conductive pattern 120 may be the minimal length measured along the Z-axis direction. Please refer to FIGS. 1, 2A and 2B. In an implementation of the present disclosure, the conductive pattern 110 has a width W1 and is electrically connected to the signal line 130. The signal line 130 may be a data line, for example. The conductive pattern 120 has a width W2 and is electrically connected to the signal line 140. The signal line 140 may be, for example, a signal line which transmits the VDD voltage of a component and W1 is smaller than W2. In another embodiment of the present disclosure, if the signal line 130 to which the conductive pattern 110 corresponds is, for example, a signal line which transmits a Vss voltage, and the signal line 140 to which the conductive pattern 120 corresponds to is, for example, a data line and W1 may be greater than W2. The width of each conductive pattern may be determined according to the implementation of the electronic device 100 of the present disclosure. In addition, it should be noted that although the conductive pattern 110, the conductive pattern 111 and the conductive pattern 120 shown in FIGS. 2A and 2B all have angular patterns with cross-sectional shapes similar to "I" shape, the present disclosure is not limited thereto. However, the corners of the conductive patterns may also be rounded corners, arced corners, or have other shapes.

The conductive pattern 110, the conductive pattern 111, the conductive pattern 120 or the conductive pattern 121 may respectively include the same or different conductive materials, but the present disclosure is not limited thereto. For example, in some embodiments, the conductive pattern 110 and the conductive pattern 111 may have the same conductive material, and the conductive pattern 120 and the conductive pattern 121 may be made of another conductive material, but the present disclosure is not limited thereto. The materials of the conductive patterns may be different from one another, or may be partially the same, or may have other suitable material selections as long as the purposes of the present disclosure may be achieved. Please refer to FIG. 2A and FIG. 2B, taking the conductive pattern 110 and the conductive pattern 120 as an example, in an embodiment of the present disclosure, the different electrical resistances between the conductive pattern 110 and the conductive pattern 120 is formed by means of a difference in materials of the two. By means of the selection of different materials, the impedance σ1 of the conductive pattern 110 and the impedance σ2 of the conductive pattern 120 are resultantly different, to result in different electrical resistances. Please refer to FIG. 1, the conductive pattern 110, the conductive pattern 111, the conductive pattern 120 or the conductive pattern 121 may respectively include a suitable transparent or opaque conductive material, for example, indium tin oxide (ITO), gold (Au), silver (Ag), tin (Sn), copper (Cu), aluminum (Al), molybdenum (Mo), titanium (Ti), tantalum (Ta), niobium (Nb), hafnium (Hf), nickel (Ni), chromium (Cr), cobalt (Co), zirconium (Zr), tungsten (W), alloys of the above, or a combination thereof, but the present disclosure is not limited thereto. Different conductive materials have different electrical conductivity (S/m). For example, the relative electrical conductivity is silver>copper>annealed copper>gold>aluminum. Under certain conditions, different conductive patterns are designed to have the same width and the same thickness, but the present disclosure is not limited thereto. That is to say, this embodiment only involves the comparison of the difference in material of two or more conductive patterns in the absence of limitations such as the number, the width, the thickness or the shape of the conductive patterns. For example, the number, the width, the thickness or the shape of the conductive patterns may be the same or different as long as the materials for use in at least two or more conductive patterns are different to result in different electrical resistances.

In another variant embodiment, different conductive patterns may be configured to be a stack structure of multilayer metal materials. For example, the conductive pattern 110 may be designed to use a conductive material of high electrical conductivity close to the side surface 152-4, such as silver, and a conductive material of higher hardness, such as aluminum, far away from the side surface 152-4. In this embodiment, combinations of stacking different conductive materials may achieve a low impedance effect, or to enhance the scratch resistance of the conductive patterns.

Figure 3:
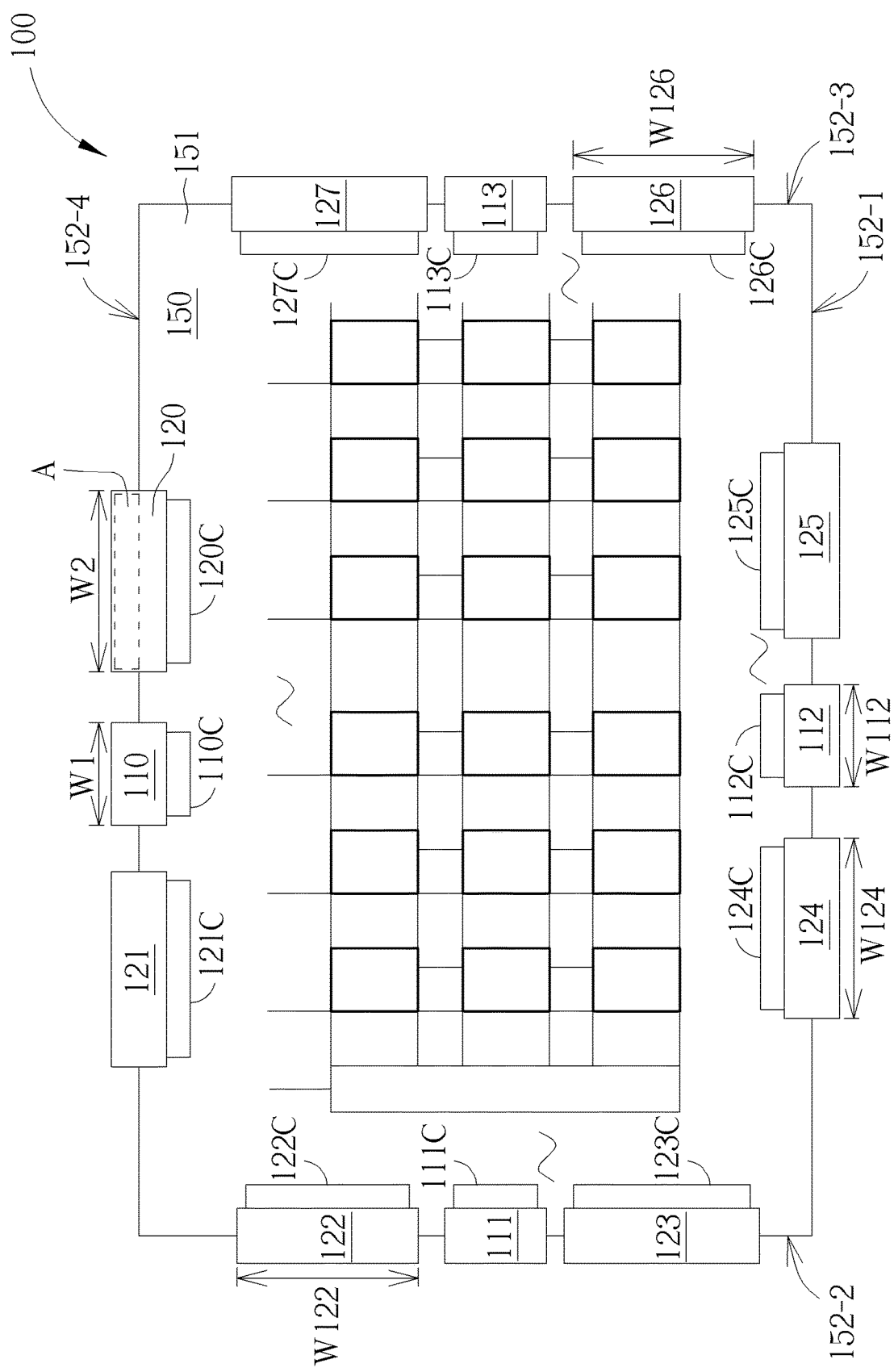
FIG. 3 illustrates a schematic top view of the implementation of the second embodiment of the electronic device of the present disclosure.

Please refer to FIG. 3. FIG. 3 illustrates a schematic top view of an embodiment of the electronic device 100 of the present disclosure. In an embodiment of the present disclosure, conductive patterns of different impedances, for example, the conductive pattern 110 and the conductive pattern 120 may be arranged nearby to go with the circuit design requirements of the electronic device 100. And the conductive patterns corresponding to the same signal line may be staggered to be arranged on the side surface 152. For example, if the conductive pattern 121 and the conductive pattern 123 correspond to the same signal line(s), the conductive pattern 121 may be provided on the side surface 152-4, and the conductive pattern 123 is provided on the side surface 152-2. The term "corresponding to the same signal line(s)" refers to "in correspondence to the same type of signal line(s)", for example, to signal lines which transmit data signals, or corresponds to the same signal line. In an embodiment of the present disclosure, the conductive pattern 121, the conductive pattern 123, the conductive pattern 125 and the conductive pattern 127 correspond to the same signal line. For the convenience of the following descriptions, these four conductive patterns are referred to as the first group of conductive patterns. The conductive patterns 120, the conductive pattern 122, the conductive pattern 124 and the conductive pattern 126 correspond to the same signal line, and these four conductive patterns are referred to as the second group of conductive patterns; the conductive pattern 110 and the conductive pattern 112 correspond to the same signal line, and the two conductive patterns are referred to as the third group of conductive patterns; the conductive pattern 111 and the conductive pattern 113 correspond to the same signal line, and these two conductive patterns are referred to as the fourth group of conductive patterns. The different electrical resistances of two groups of conductive patterns, for example, the first group of conductive patterns and the third group of conductive patterns, are formed by means of a difference in a sum of all widths of all conductive patterns in the first group of conductive patterns and in a sum of all widths of all conductive patterns in the second group of conductive patterns, for example, the value of the width W2 of the conductive pattern 120 plus the width W122 of the conductive pattern 122 plus the width W124 of the conductive pattern 124 plus the width W126 of the conductive pattern 126 are different from the value of the width W1 of the conductive pattern 110 plus the width W112 of the conductive pattern 112. In another embodiment, it is formed by means of a difference in total numbers of conductive patterns in each group, but the present disclosure is not limited thereto. The embodiment shown in FIG. 3 facilitates the use of space on the side surface 152 to distribute the conductive patterns corresponding to the same signal line to the peripheries of the substrate 150. It is noted that the conductive patterns corresponding to the same signal line may not have to be like the first group or the second group of conductive patterns to be disposed on the four portions of the side surface 152. They may alternatively be disposed on one or two portions of the side surface 152, such as on the side surface 152-4 and on the side surface 152-1, to be adjustable according to the design requirements. The total widths of the conductive patterns corresponding to different signal lines are designed to be not the same so that two or more conductive patterns corresponding to different signal lines respectively have different electrical resistances. It is noted that this embodiment only involves the comparison of differences in width of two or more conductive patterns in the absence of limitations such as the material, the number, the thickness or the shape between the conductive patterns. For example, the material, the number, the thickness or the shape of the conductive patterns may be the same or different, as long as the widths of at least two or more conductive patterns are different to result in different electrical resistances. In another embodiment, the different electrical resistances between two or more conductive patterns are formed by means of a difference in the effective area of the conductive patterns. The effective area of a conductive pattern may be the maximal area of a portion of the top surface 151 which does not overlap the conductive pattern from the top view direction, as the effective area A shown in FIG. 3. The effective area of conductive pattern(s) may refer to the effective area of a single conductive pattern, such as the effective area A of the conductive pattern 120, or the sum of the effective areas of the conductive patterns in the same group, such as the sum of the respective effective area of the conductive pattern 120, of the conductive pattern 122, of the conductive pattern 124 and of the conductive pattern 126, but the present disclosure is not limited thereto. As shown in FIG. 3, the electronic device 100 may further include a conductive pad 110C, a conductive pad 111C, a conductive pad 112C, a conductive pad 113C, a conductive pad 120C, a conductive pad 121C, a conductive pad 122C, a conductive pad 123C, a conductive pad 124C, a conductive pad 125C, a conductive pad 126C and conductive pad 127C, each corresponds to a conductive pattern. For example, the conductive pad 110C corresponds to the conductive pattern 110, so do the conductive patterns which other conductive pads correspond to, so the details are not elaborated. In another embodiment, the conductive pattern 110 may be electrically connected to the corresponding signal line through the conductive pad 110C.

Figure 4:
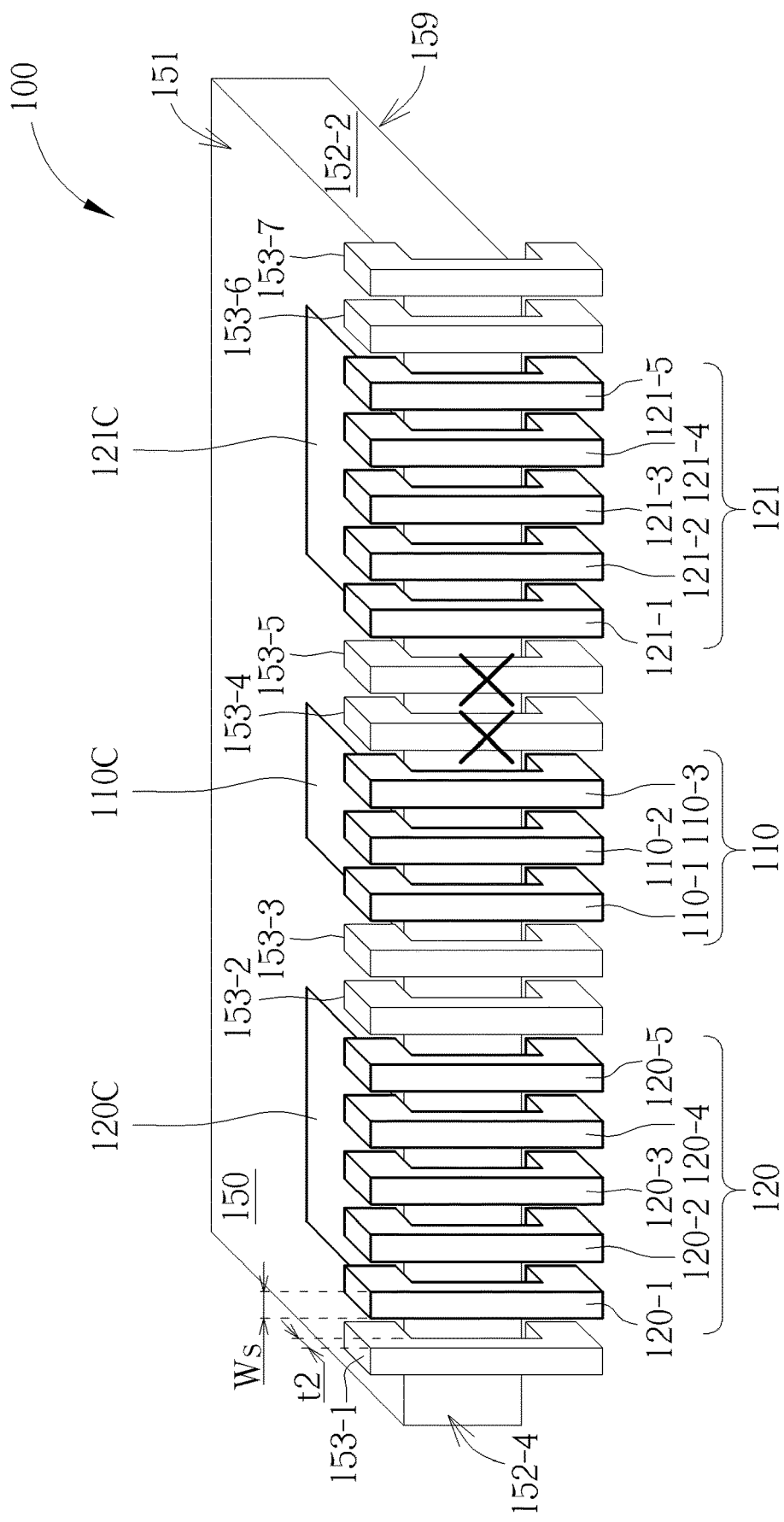
FIG. 4 illustrates a schematic partial side view of different conductive patterns corresponding to FIG. 3.

Please refer to FIG. 4. FIG. 4 is a partial schematic side view of different conductive patterns corresponding to FIG. 3. For example, each conductive pattern may include one or more sub-patterns. Please note that a sub-pattern is the conductive pattern itself if the conductive pattern includes not more than one sub-pattern. In addition, the sub-patterns shown in FIG. 4 have angular patterns with cross-sectional shapes similar to "I" shape or "C" shape, but the present disclosure is not limited thereto. The corners of the conductive patterns may also be rounded corners, arced corners, or have other shapes.

In an embodiment of the present disclosure, the conductive pattern 110 includes, for example, a sub-pattern 110-1, a sub-pattern 110-2, and a sub-pattern 110-3, the conductive pattern 120 includes, for example, a sub-pattern 120-1, a sub-pattern 120-2, a sub-pattern 120-3, a sub-pattern 120-4, a sub-pattern 120-5, and the conductive pattern 121 includes, for example, a sub-pattern 121-1, a sub-pattern 121-2, a sub-pattern 121-3, a sub-pattern 121-4 and a sub-pattern 121-5, but the present disclosure is not limited thereto. Each sub-pattern may have the same width or different widths, but the present disclosure is not limited thereto. FIG. 4 shows that each sub-pattern may have the same width Ws, but the present disclosure is not limited thereto. In an embodiment, the total number of the sub-patterns of the conductive pattern 120 may be greater than that of the sub-patterns of the conductive pattern 110 so that the conductive pattern 120 and the conductive pattern 110 may respectively have different electrical resistances. Specifically speaking, please refer to FIG. 1 at the same time. For example, the conductive pattern 120 is electrically connected to the signal line 140, and the conductive pattern 110 is electrically connected to the signal line 130. The signal line 140 is, for example, a signal line which transmits VDD voltage for components, and the signal line 130 is, for example, a signal line which transmits a data signal. Please refer to 4, the total number of sub-patterns of the conductive pattern 120 is 5, the total number of the sub-patterns of the conductive pattern 110 is 3 so that the conductive pattern 120 and the conductive pattern 110 may have different electrical resistances. In other words, the different electrical resistance between the conductive pattern 110 and the conductive pattern 120 is formed by means of a difference in numbers of the sub-patterns of the conductive pattern 110 and of the sub-patterns of the conductive pattern 120. In yet another embodiment, the total number of sub-patterns of the conductive pattern 121 may be greater than that of the sub-patterns of the conductive pattern 110, but the present disclosure is not limited thereto. It is noted that this embodiment only involves the comparison of differences in total number of the sub-patterns between two or more conductive patterns in the absence of limitations such as the material, the width, the thickness or the shape between the conductive patterns. For example, the material, the width, the thickness or the shape of the conductive patterns may be the same or different as long as the total number of the sub-patterns of at least two or more conductive patterns are different to result in different electrical resistances.

In some embodiments, the width of the conductive pattern 110 may be the sum of the widths of the sub-pattern 110-1, of the sub-pattern 110-2 and of the sub-pattern 110-3. That is to say, taking an embodiment of the same width as an example, the sum of the widths of the sub-pattern 110-1, of the sub-pattern 110-2 and of the sub-pattern 110-3 is Ws+Ws+Ws=3Ws. The width of the conductive pattern 120 may be the sum of the widths of the sub-pattern 120-1, of the sub-pattern 120-2, of the sub-pattern 120-3, of the sub-pattern 120-4 and of the sub-pattern 120-5, that is, taking an embodiment of the same width as an example, the total widths of the sub-pattern 120-1, of the sub-pattern 120-2, of the sub-pattern 120-3, of the sub-pattern 120-4 and of the sub-pattern 120-5 is Ws+Ws+Ws+Ws+Ws=5Ws. In other words, the width 3Ws of the conductive pattern 110 is not equal to the width 5Ws of the conductive pattern 120. As a result, the conductive pattern 110 and the conductive pattern 120 respectively have different electrical resistance to correspond to the loading requirements of different signal voltages. For example, the total width at the high signals is greater than the total width at the low signals.

Please refer to FIG. 4, there may be one or more dummy sub-patterns which are not electrically connected to any conductive pattern and disposed between each conductive pattern, that is, the one which is electrically connected to the conductive pad is a sub-pattern, and the one which is not electrically connected to the conductive pad is a dummy sub-pattern. For example, FIG. 4 illustrates that a dummy sub-pattern 153-1, a dummy sub-pattern 153-2, a dummy sub-pattern 153-3, a dummy sub-pattern 153-4, a dummy sub-pattern 153-5, a dummy sub-pattern 153-6 and a dummy sub-pattern 153-7 are not connected to any conductive pad; on the other hand, the sub-pattern 120-3 is electrically connected to the conductive pad 120C. Each dummy sub-pattern may be formed in the same process along with each sub-pattern, that is, multiple sub-patterns may be formed on the side surface 152-4 by the same process, then the total number of sub-patterns is selected according to the required width of each conductive pattern, such as the conductive pattern 120 or the conductive pattern 110, and the unselected sub-patterns are regarded as dummy sub-patterns. The above-mentioned design may help simplify the manufacturing process. There may be space between a sub-pattern and a dummy sub-pattern to expose a part of the side surface. For example, a part of the side surface 152-4 disposed between the dummy sub-pattern 153-2 and the sub-pattern 120-5 may be exposed.

In another embodiment of the present disclosure, the dummy sub-pattern(s) may also be selectively destroyed so that the dummy sub-pattern (s) may have no function to have no influence on adjacent sub-patterns to reduce the problem of signal noise interference. For example, physical cutting (such as laser cutting) to the dummy sub-patterns 153-4 and to the dummy sub-patterns 153-5 (for example, "X" marked in the figure) may be carried out to reduce the chance of the electrical connection of the dummy sub-patterns 153-4 or of the dummy sub-pattern 153-5 to the sub-pattern 110-3 or the sub-pattern 121-1, but the present disclosure is not limited thereto, or to compensate the process errors in the process. For example, the range of the conductive pad 110C incorrectly extends to the dummy sub-pattern 153-4 to make the conductive pad 110C electrically connected to the dummy sub-pattern 153-4. For example, by using physical cutting on the dummy sub-pattern 153-4, it may compensate the process errors in the process and improve the process yield.

Figure 5:
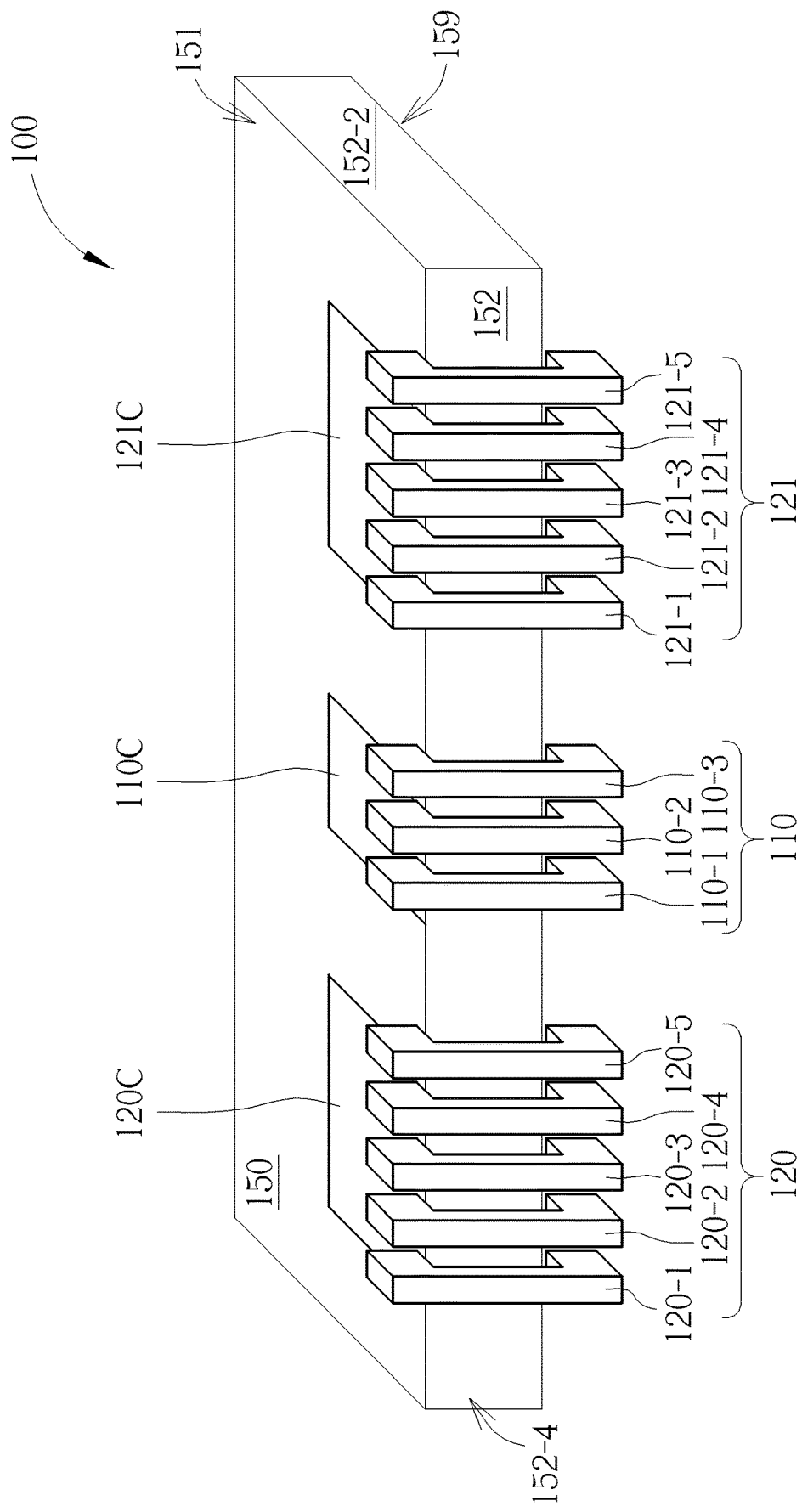
FIG. 5 is a partial schematic side view of a variant implementation of the second embodiment corresponding to FIG. 3.

Please refer to FIG. 5. FIG. 5 is a partial schematic side view of another embodiment of the electronic device 100 of the present disclosure. In this embodiment, a part of the side surface 152, such as the side surface 152-4, may optionally not be provided with a dummy sub-pattern. In other words, there is no dummy sub-pattern disposed between the sub-pattern 110-3 and the sub-pattern 121-1. The use of this embodiment is beneficial to strengthen the electrical insulation between adjacent conductive patterns and to reduce some disadvantageous signal noise interference.

Figure 6:
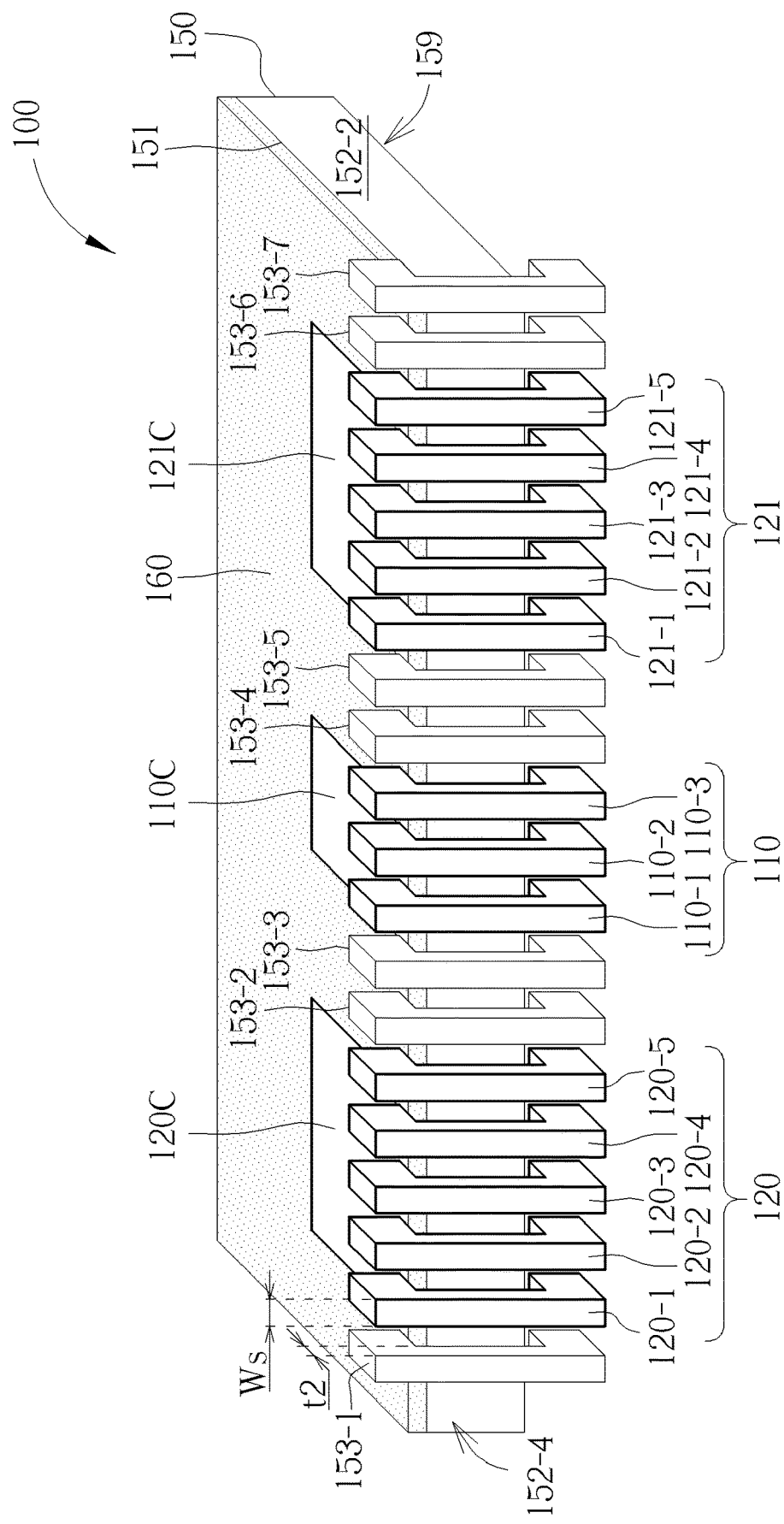
FIG. 6 illustrates a partial schematic side view of another variant implementation of the second embodiment corresponding to FIG. 3.

Please refer to FIG. 6, which is a partial schematic side view of an embodiment of the present disclosure. In this embodiment, a passivation layer 160 may be optionally provided on the top surface 151 of the electronic device 100 to be beneficial to reduce some disadvantageous noise interference. For example, the top surface 151 of the electronic device 100 may be first provided with a passivation layer 160, and then openings of the passivation layer 160 corresponding to the conductive pad 110C, the conductive pad 120C and the conductive pad 121C are formed to expose the conductive pad 110C, the conductive pad 120C and the conductive pad 121C, next the conductive patterns are formed by printing. The passivation layer 160 may include an inorganic insulating material, such as silicon nitride, silicon oxide, or a mixture thereof, but the present disclosure is not limited thereto. The openings of the above-mentioned passivation layer 160 may be performed by, for example, a photolithographic etching process, but the present disclosure is not limited thereto. FIG. 6 further illustrates a dummy sub-pattern 153-1, a dummy sub-pattern 153-2, a dummy sub-pattern 153-3, a dummy sub-pattern 153-4, a dummy sub-pattern 153-5, a dummy sub-pattern 153-6 and a dummy sub-pattern 153-7 which are not connected to any conductive pad.

Please refer to FIG. 7A. FIG. 7A is a schematic cross-sectional view along the line A-A' of FIG. 1. The different electrical resistance between two or more conductive patterns is formed by means of a difference in thicknesses of the conductive patterns. For example, please refer to FIG. 1, the different electrical resistance between the conductive pattern 120 and the conductive pattern 110 is formed by means of a difference in thicknesses of the conductive pattern 120 and of the conductive pattern 110. By means of different thickness designs, the conductive patterns have different electrical resistance. The thickness may refer to the maximal thickness of any conductive pattern along the Y direction on the side surface. For example, as shown in FIG. 7A, the thickness of the conductive pattern 120 is the maximal thickness extending from the side surface 152-2 to the outermost surface of the conductive pattern 120 along the Y direction (for example, the surface 120A), such as the thickness t2. FIG. 7B shows another embodiment of the present disclosure. In this embodiment, the conductive pattern 120 may be disposed in, for example the cut corner 120N on the side surface 152-2. For example, the cut corner 120N may extend toward the direction of the substrate 150 so that a part of the conductive pattern 120 may be accommodated in the cut corner 120N, but the present disclosure is not limited thereto. The thickness of the conductive pattern 120 is the maximal thickness extending from the innermost side of the side surface 152-2 along the Y direction, such as the position of the point P, to the outermost surface (such as the surface 120A) of the conductive pattern 120, such as the thickness t2. In the present disclosure, the method of adjusting the thickness may be, for example, to increase the spray amount through a mold, or to increase the thickness through multiple coatings. In an embodiment of the present disclosure, for example, the conductive pattern 110 may have a thickness t1 (not shown), and the second conductive pattern 120 has a thickness t2. If the thickness t1≠the thickness t2 (not shown), the conductive pattern 110 and the conductive pattern 120 have different electrical resistance. In another embodiment of the present disclosure, please refer to FIG. 1, for example, the conductive pattern 110 has a thickness t1, and its corresponding signal line 130 is, for example, a data line. The conductive pattern 121 has a thickness t3 (not shown), and its corresponding signal line 141 is, for example, a signal line for transmitting the Vss voltage, and the thickness t1 is less than the thickness t3, but the present disclosure is not limited thereto. In another embodiment, if the signal line 130 corresponding to the conductive pattern 110 is, for example, a signal line which transmits the Vss voltage, and the signal line 141 corresponding to the conductive pattern 121 is, for example, a data line, the thickness t1 of the conductive pattern 110 is greater than the thickness t3 of the conductive pattern 121. The thickness t1 of the conductive pattern 110, the thickness t2 of the conductive pattern 120 and the thickness t3 of the conductive pattern 121 may be determined according to the implementation of the electronic device 100 of the present disclosure. In yet another embodiment, different conductive patterns may have different volumes. The volume of a conductive pattern may be area=thickness*width*length. For example, by referring to FIGS. 3 and 7A, the area A of the conductive pattern 120 is the product of these three, i.e., the thickness t2 of the conductive pattern 120, the width W2 of the conductive pattern 120 and the length L2 of the conductive pattern 120. In yet another embodiment, the width W1 of the conductive pattern 110 and the width W2 of the conductive pattern 120 may be substantially the same, and the thickness t1 of the conductive pattern 110 and the thickness t2 of the conductive pattern 120 are different so that the conductive pattern 110 and the conductive pattern 120 respectively have different electrical resistance. It is noted that this embodiment only involves the comparison of differences in thickness between two or more conductive patterns in the absence of limitations such as the material, the width, the number or the shape of the conductive patterns. For example, the material, the width, the number or the shape of the conductive patterns may be the same or different as long as the thicknesses of at least two or more conductive patterns are different to result in different electrical resistance.

Figure 8A:
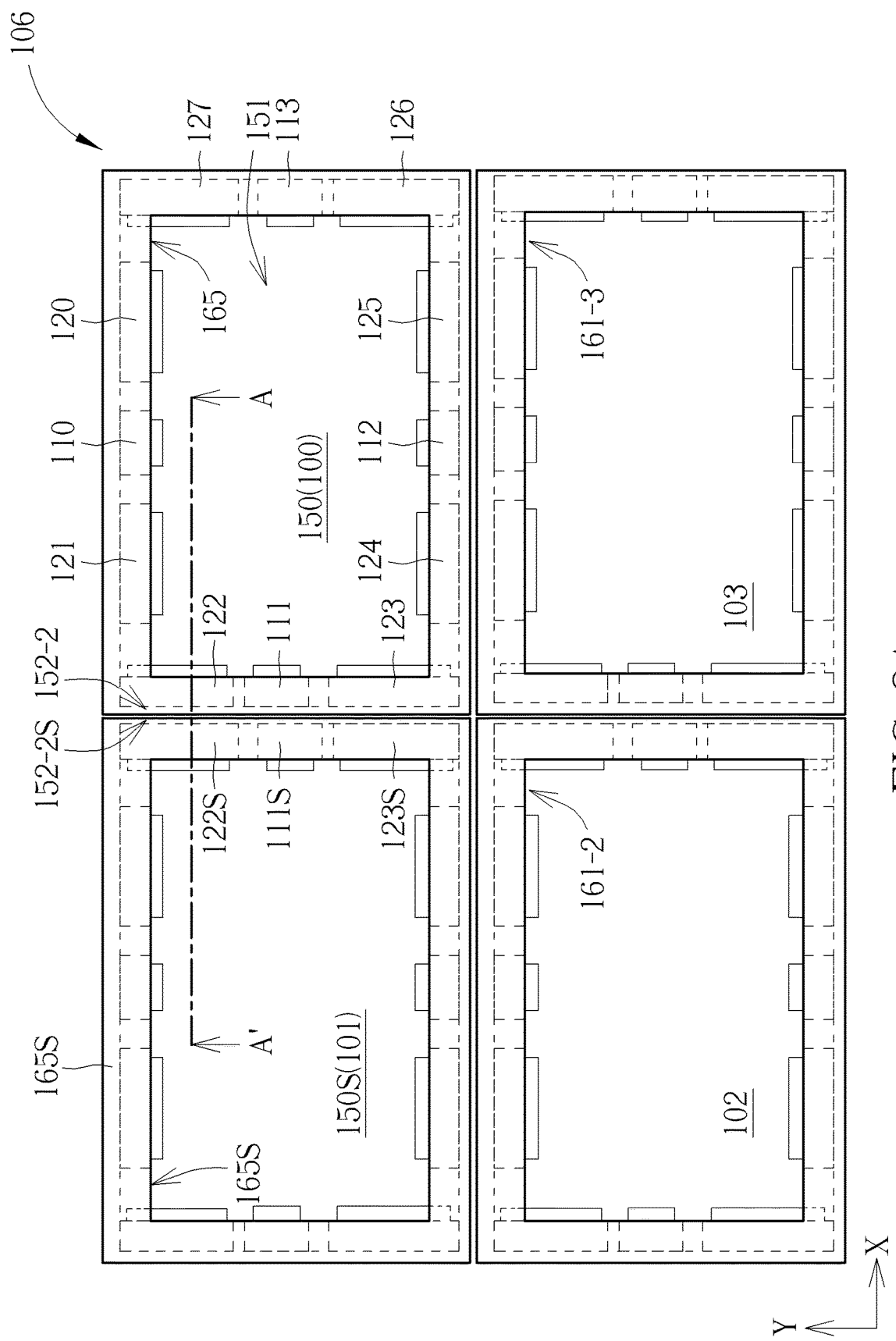
FIG. 8A illustrates a schematic top view of an implementation of the third example of the electronic device of the present disclosure.
Figure 8B:
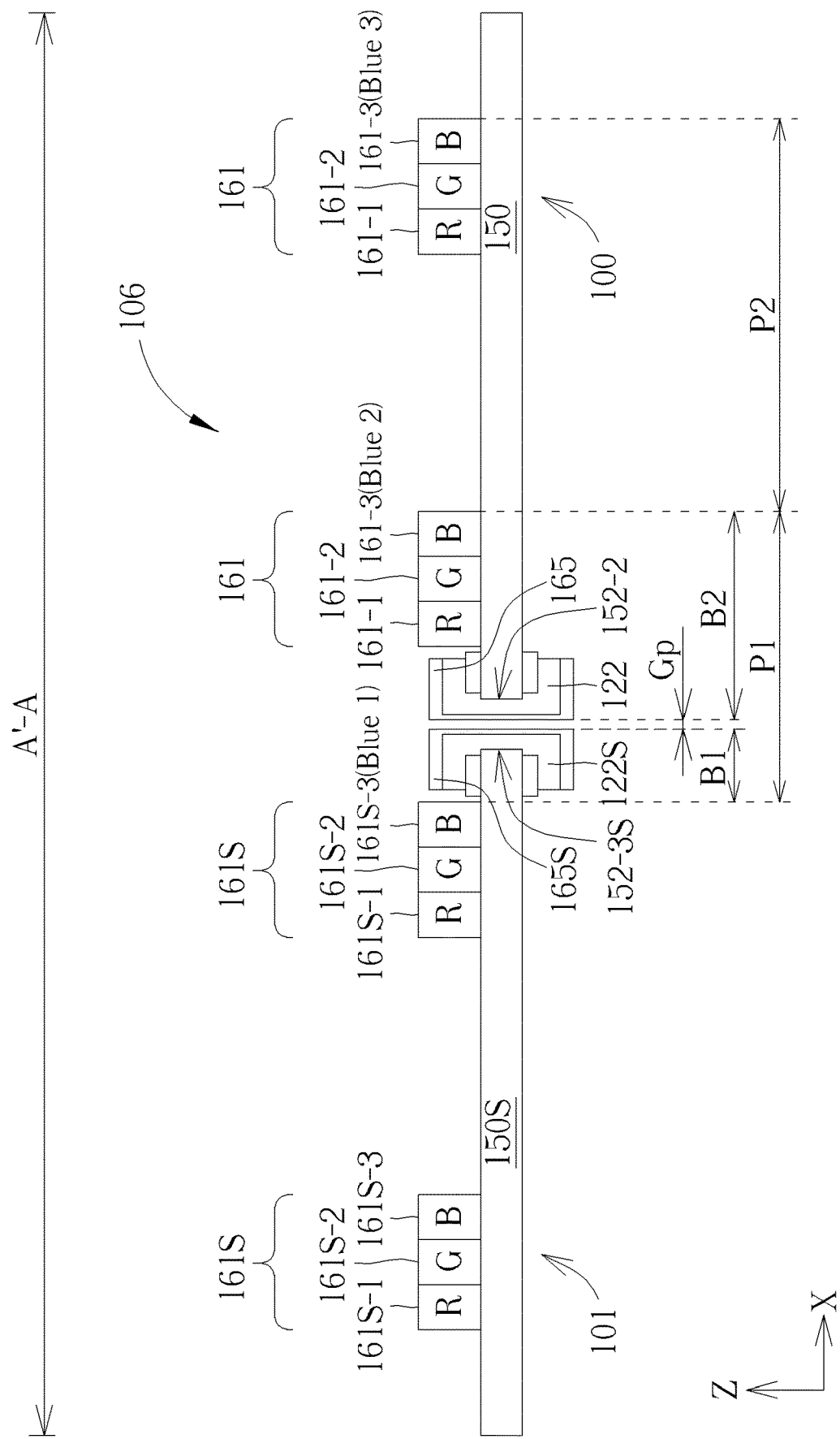
FIG. 8B illustrates a schematic side view corresponding to the cross-sectional line A-A' between two adjacent electronic devices in FIG. 8A.

Please refer to FIGS. 8A and 8B. FIG. 8A is a schematic top view of an implementation of the third example of the electronic device 100 of the present disclosure. In an implementation of this embodiment, a tiling type display 106 may include the adjacent electronic device 100, the electronic device 101, the electronic device 102 and electronic device 103, and may form a protection element on each conductive pattern after each conductive pattern of the electronic device is formed so that each conductive pattern of each electronic device may be covered by the protection element. For example, taking the electronic device 100 as an example, a protection element 165 may be arranged at the locations of each conductive pattern so that the protection element 165 at least partially overlaps the conductive pattern 110, the conductive pattern 111, the conductive pattern 112, the conductive pattern 113, the conductive pattern 120, the conductive pattern 121, the conductive pattern 122, the conductive pattern 123, the conductive pattern 124, the conductive pattern 125, the conductive pattern 126 and the conductive pattern 127 in the top view direction, and the protection element 165 exposes a part of the top surface 151 of the substrate 150. In another embodiment, the protection element 165 may cover the side surface 152 of the substrate 150 and each conductive pattern, but the present disclosure is not limited thereto. The term "each conductive pattern may be covered by a protection element" in this disclosure means that there may be other layers between each conductive pattern and the protection element, or that there is no other layer between each conductive pattern and the protection element. In another implementation of this embodiment, the protection element 165 may also be disposed on one or more conductive patterns, but the present disclosure is not limited thereto. It may help reduce the oxidation rate of the metal material of the conductive patterns, and/or increase the scratch resistance of each conductive pattern, or facilitate the electrical insulation or reduce signal interference with respect to adjacent conductive patterns. For example, the conductive pattern 122 of the electronic device 100 and the conductive pattern 122S of the electronic device 101 may respectively correspond to different signal lines. The protection element 165 is provided on the conductive pattern 122 and on the side surface 152-2 of the electronic device 100. The protection element 165S is provided on the conductive pattern 122S and on the side surface 152-2S of the electronic device 101 to reduce the signal interference phenomenon when the conductive pattern 122 and the conductive pattern 122S are transmitting different signals. The protection element 165 or the protection element 165S may include an inorganic protective material, an organic protective material, or a combination of the two. The inorganic protective material, for example, may include silicon nitride, silicon oxide, or a combination of the above, but the present disclosure is not limited thereto. The organic protective layer, for example, may include perfluoroalkoxy alkane, a resin, an epoxy, polyethylene terephthalate (PET), or a combination thereof.

Please refer to FIG. 8B. FIG. 8B illustrates a schematic side view corresponding to the line A-A' between two adjacent electronic device 100 and electronic device 101 in FIG. 8A. The electronic device 100 includes a substrate 150, a display unit 161, a conductive pattern 122, and a protection element 165. The electronic device 101 is disposed adjacent to the electronic device 100. The electronic device 101 includes a substrate 150S, a display unit 161S, a conductive pattern 122S and a protection element 165S. The substrate 150S is disposed adjacent to the substrate 150. There is a pitch P1 between display units on adjacent substrates, such as the substrate 150S and the substrate 150, and there is a pitch P2 between adjacent display units on the same substrate. The pitch P2 is defined as the minimal distance between the same sides of the same color. For example, taking the display unit 161 including three light-emitting units as an example, the pitch P2 may be the minimal distance between the same sides of Blue 2 and of Blue 3. It is also the minimal distance between the same sides from one light-emitting unit 161-3 to the nearest light-emitting unit 161-3. The pitch P1 is defined as B1+B2+Gp. B1 is defined as the distance from Blue 1, that is, one side of the light-emitting unit 161S-3, to the outmost edge of the entire electronic device 101 along the X direction. B2 is defined as the distance of Blue 2, that is, from the side of the light emitting unit 161-3 farther from the side surface 152-2, to the outmost edge of the entire electronic device 100 along the X direction. In the design of this embodiment, the pitch P1 should be close to the pitch P2 as much as possible. However taking the tolerance of the tiling process into consideration, for example, it is limited that $0.8*P2 \le P1 \le 1.2*P2$. If the pitch P1 falls in this range, it is beneficial to align the images of the tiling display 106 or to improve the display quality.

The distance between two adjacent electronic devices is the gap (Gp). For example, the distance between the side of the protection element 165 of the electronic device 100 farther from the side surface 152-2 and the protection element 165S of the electronic device 101 farther from the side surface 152-2S is the gap Gp. Reduction of the gap Gp may facilitate to slim the borders of each display device in the tiling display 106, or have a bezel-less structure, or even further to achieve the structural advantage of seamless tiling. In an embodiment of the present disclosure, the gap Gp may satisfy the following relationship to be beneficial to slim the borders of each display device in the tiling display 106 or to achieve the advantage of seamless tiling.

$$0.8*P2 \le (B1+B2+Gp) \le 1.2*P2$$

Figure 9:
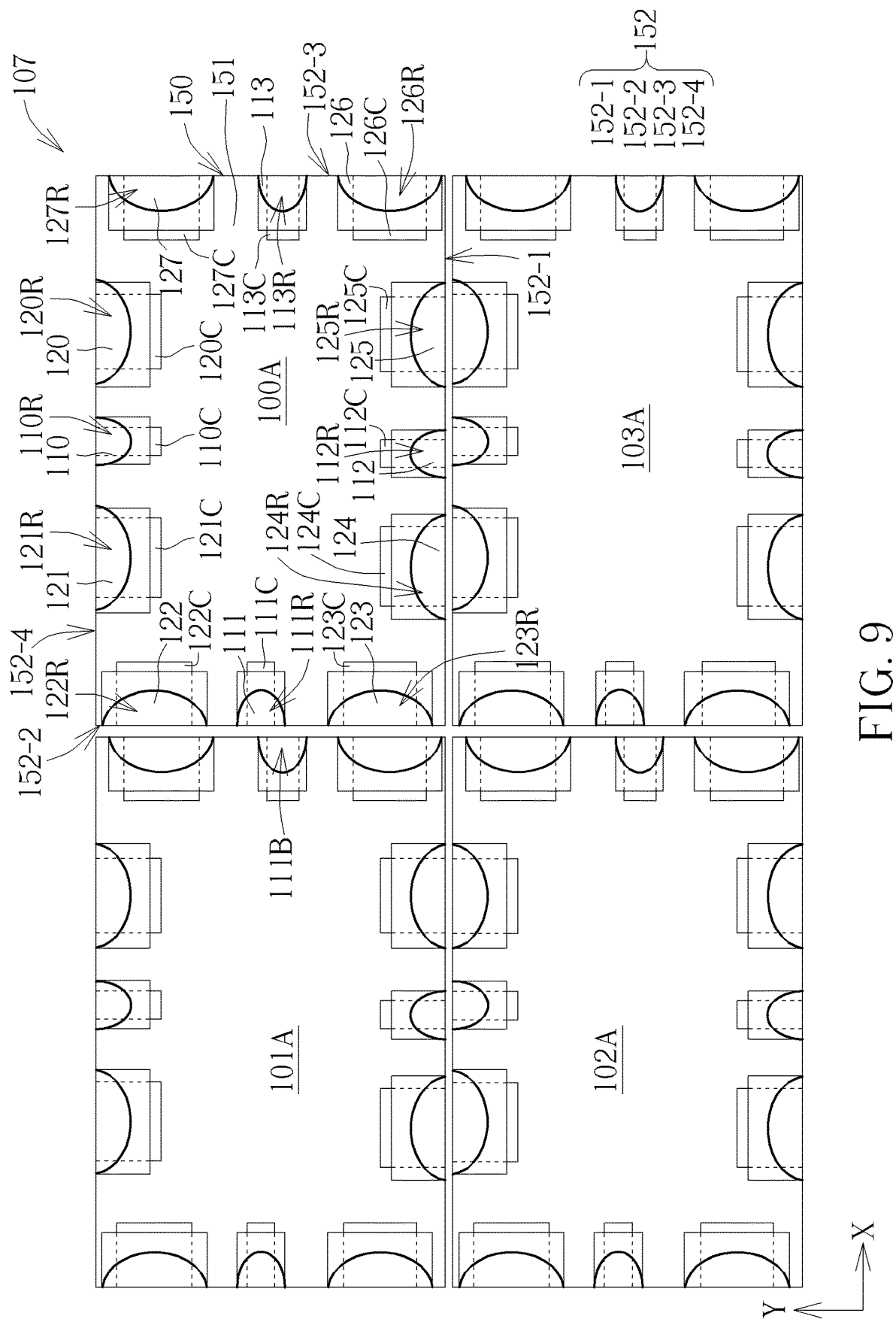
FIG. 9 illustrates a schematic top view of a tiling display according to an implementation of the fourth example of the electronic device of the present disclosure.

Please refer to FIG. 9. FIG. 9 illustrates a schematic top view of the tiling display 107 of an embodiment of the electronic device of the present disclosure. In this embodiment, the tiling display 107 includes an electronic device 100A, an electronic device 101A, an electronic device 102A and an electronic device 103A. Taking the electronic device 100A as an example, it includes a substrate 150, a conductive pattern 110, a conductive pattern 111, a conductive pattern 112, a conductive pattern 113, a conductive pattern 120, a conductive pattern 121, a conductive pattern 122, a conductive pattern 123, a conductive pattern 124, a conductive pattern 125, a conductive pattern 126, a conductive pattern 127, a conductive pad 110C which is correspondingly arranged with respect to the conductive pattern 110, a conductive pad 111C which is correspondingly arranged with respect to the conductive pattern 111, a conductive pad 112C which is correspondingly arranged with respect to the conductive pattern 112, a conductive pad 113C which is correspondingly arranged with respect to the conductive pattern 113, a conductive The pad 120C which is correspondingly arranged with respect to the conductive pattern 120, a conductive pad 121C which is correspondingly arranged with respect to the conductive pattern 121, a conductive pad 122C which is correspondingly arranged with respect to the conductive pattern 122, a conductive pad 123C which is correspondingly arranged with respect to the conductive pattern 123, a conductive pad 124C which is correspondingly arranged with respect to the conductive pattern 124, a conductive pad 125C which is correspondingly arranged with respect to the conductive pattern 125, a conductive pad 126C which is correspondingly arranged with respect to the conductive pattern 126 and a conductive pad 127C which is correspondingly arranged with respect to the conductive pattern 127, but the present disclosure is not limited thereto. The substrate 150 has a top surface 151 and a side surface 152. The side surface 152 surrounds the top surface 151. The side surface 152 may include four portions, for example, a side surface 152-1, a side surface 152-2, a side surface 152-3 and a side surface 152-4, and the side surface 152-1, the side surface 152-2, the side surface 152-3 and the side surface 152-4 are disposed around the top surface 151, but the present disclosure is not limited thereto. In this embodiment, a conductive pad is disposed between the top surface 151 and a conductive pattern, for example, the conductive pad 126C is disposed between the top surface 151 and the conductive pattern 126.

In this embodiment, the substrate 150 may further include one or more notches. In a manufacturing method of the present disclosure, a patterning step may be carried out on the substrate 150 to selectively remove some part of the sides of the substrate 150 to form one or more notches. Specifically speaking, some part of the top surface 151, some part of the bottom surface (not shown, please refer to the bottom surface 159 shown in FIG. 7A for example) and some part of the side surface 152 of the substrate 150 may be selectively removed to form one or more notches. Taking this embodiment as an example, removing some part of the top surface 151, some part of the bottom surface and some part of the side surface 152-4 may form, for example, the notch 121R, the notch 110R and the notch 120R. Similarly, a notch 127R, a notch 113R, a notch 126R, a notch 125R, a notch 112R, a notch 124R, a notch 123R, a notch 111R and a notch 122R are formed on respectively corresponding locations. Each notch may be provided to correspond to the positions of the respective conductive pattern. For example, the notch 110R corresponds to the conductive pattern 110 or the notch 120R corresponds to the conductive pattern 120. It is noted that at least one conductive pattern may not necessarily align with the side of the notch to which it corresponds. In a manufacturing method of the present disclosure, a conductive pad may be first provided on the top surface 151, and then each conductive pattern may be correspondingly formed after a patterning step is carried out on the substrate 150. In another manufacturing method, some of the conductive pads may be removed during the patterning step of the substrate 150.

In response to conductive patterns with different electrical resistance values, each notch may have different sizes or shapes to accommodate conductive patterns with different electrical resistance values. For example, corresponding to a conductive pattern with a smaller electrical resistance value, a notch may have a larger volume to accommodate a larger conductive pattern. A notch which has a larger volume may have a larger width, a larger recessed depth, or a combination of the two, but the present disclosure is not limited thereto. For the widths of the notches, please refer to the descriptions of the widths of the conductive patterns of FIG. 2A and FIG. 2B. If each notch shown in FIG. 9 further goes with the protection element 165 shown in FIG. 8A, the distance B1 (please refer to FIG. 8B) may possibly be reduced to be more conducive to slim the borders of each display device in the tiling display 107, or to achieve the structural advantage of seamless tiling. It should be noted that the positions of the notches between the substrates of adjacent electronic devices are not limited to be aligned with each other, and misalignment of these positions may be possible. For example, the electronic device 100A is adjacent to the electronic device 101A, and the notch 111R close to the side surface 152-2 of the substrate 150 may not align with the notch 111B on the side surface of the electronic device 101A, as shown in FIG. 9. They may have staggered arrangement along the Y direction, but the present disclosure is not limited thereto. The notch 111R and the notch 111B may be substantially aligned in the Y direction.

Figure 10:
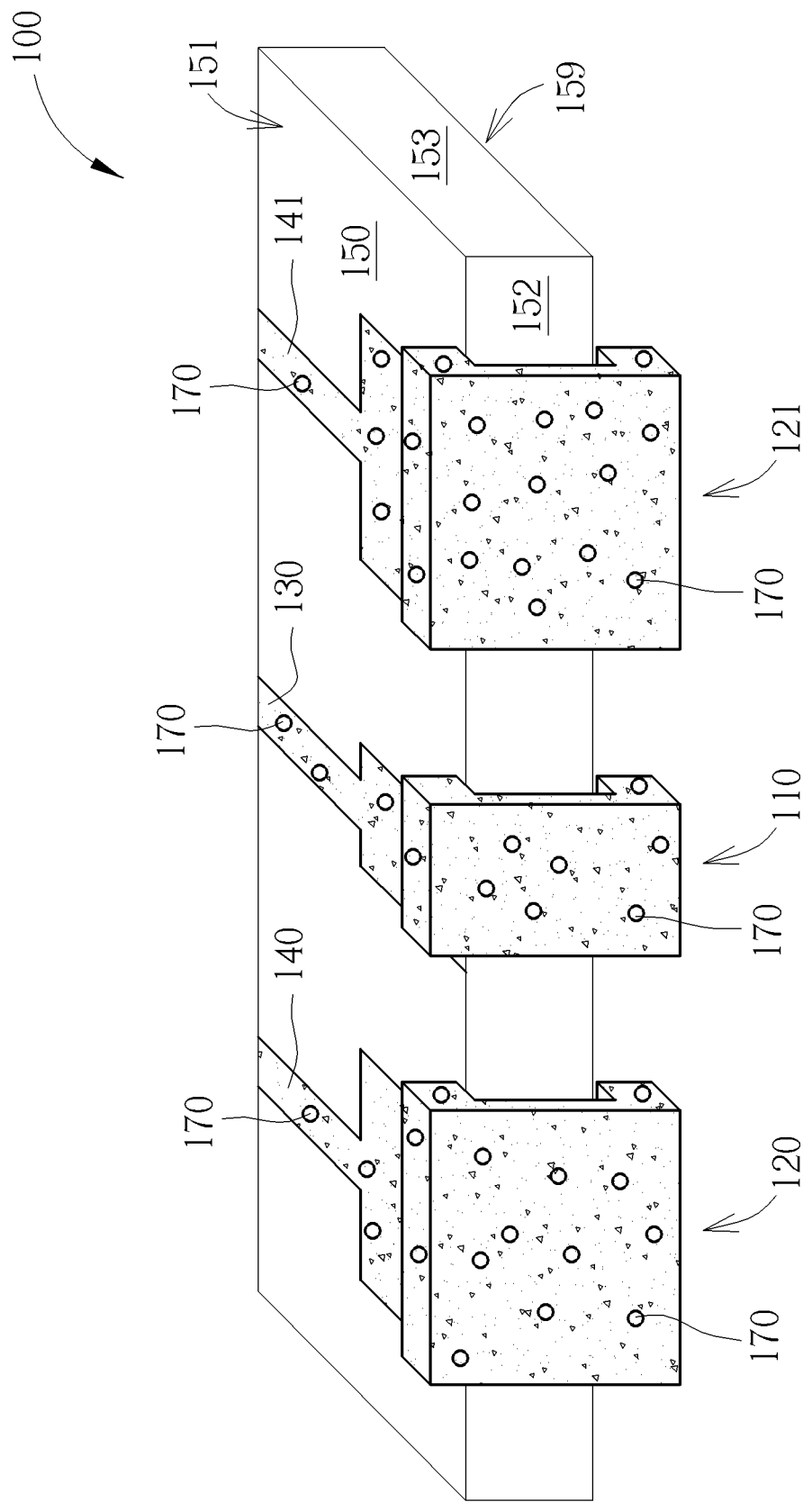
FIG. 10 illustrates a partial schematic side view of an implementation of the fifth embodiment of the electronic device of the present disclosure.

Please refer to FIG. 10. FIG. 10 illustrates a schematic partial side view of some embodiments of the electronic device 100 of the present disclosure. This embodiment is advantageous for implementing a transparent display. For example, it is possible to carry out a transparent process on those non-transparent regions such as traces, bonding pads . . . etc. in the electronic device 100 if it is desirable to have substantially the same transparency in each region of a transparent display. At least one auxiliary pattern 170 may be formed in, for example at least one of the conductive pattern 110, the conductive pattern 120, the conductive pattern 121, the signal line 130, the signal line 140 and the signal line 141 on the substrate 150 of the electronic device 100 in the transparent process. An auxiliary pattern 170, for example may be a hole or a recess, but the present disclosure is not limited thereto. The auxiliary pattern 170 may be disposed on the top surface 151 and/or the side surface 152. In an embodiment, the total area of the auxiliary patterns 170 may be greater than or equal to 30% of the area of a conductive pattern. Taking the conductive pattern 121 as an example, the ratio of the total area of the auxiliary patterns 170 in the conductive pattern 121 to the total area of the conductive pattern 121 may be greater than or equal to 30%. In another embodiment, the maximal width of the hole may be 0.1 micrometer (μm) to 20 micrometers depending on the line width if the auxiliary pattern 170 is a hole. The auxiliary pattern 170 may have a regular geometric pattern or an irregular shape, but the present disclosure is not limited thereto. The method of forming the auxiliary patterns 170 may be, by screen printing the conductive patterns, the signal lines and the auxiliary patterns with a mold (not shown), or to form the auxiliary patterns after printing the entire strips of conductive patterns, but the present disclosure is not limited thereto.

The present disclosure proposes that the electrical resistance of various conductive patterns is adjustable. The conductive patterns are used to control current signals, voltage signals, high-frequency signals or low-frequency signals of drain lines, of source lines, of signal lines, of data lines or of gate lines to design the electrical resistance of the corresponding conductive pattern in response to different signal loads to facilitate the innovation of seamless tiling displays. The different electrical resistance of one or more conductive patterns may be formed by means of a difference in number, in width, in thickness, in material, and/or in shape. The tiling boundaries of two adjacent display devices may draw near as much as possible to reduce the distance between adjacent display devices to be beneficial to slim the borders of the display devices in the tiling display, or may further achieve the structural advantage of seamless tiling.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. An electronic device, comprising:
a substrate having a top surface, a bottom surface opposite to the top surface, and a side surface surrounding the top surface and connecting the top surface and the bottom surface;
a first signal line and a second signal line which are disposed on the top surface;
a first conductive pattern disposed on the side surface and electrically connected to the first signal line; and
a second conductive pattern disposed on the side surface and electrically connected to the second signal line;
wherein, one of the first conductive pattern and the second conductive pattern has a variation in thickness along a normal direction from the bottom surface to the top surface, the first conductive pattern and the second conductive pattern have different electrical resistances, and the different electrical resistance between the first and second conductive patterns is formed by forming the first conductive pattern and second conductive pattern with different maximal thicknesses, wherein the thickness of the first conductive pattern or the second conductive pattern is measured from a side surface of the substrate to an outermost surface of the first conductive pattern or of the second conductive pattern along a direction which is perpendicular to the normal direction in a side view.

2. The electronic device of claim 1, wherein the different electrical resistance between the first and second conductive patterns is formed by means of a difference in numbers of sub-patterns of the first and second conductive patterns.

3. The electronic device of claim 1, wherein the different electrical resistance between the first and second conductive patterns is formed by means of a difference in widths of the first and second conductive patterns.

4. The electronic device of claim 1, wherein the different electrical resistance between the first and second conductive patterns is formed by means of a difference in materials of the first and second conductive patterns.

* * * * *